United States Patent [19]

Suzuki et al.

[11] 4,231,331
[45] Nov. 4, 1980

[54] PULSE GENERATOR OF THE CORONA DISCHARGE TYPE FOR SENSING ENGINE CRANKSHAFT ANGLE ON AN ENGINE CONTROL SYSTEM

[75] Inventors: Suzuo Suzuki; Hastuo Nagaishi, both of Yokosuka; Kenji Masaki, Yokohama, all of Japan

[73] Assignee: Nissan Motor Company, Limited, Yokohama City, Japan

[21] Appl. No.: 930,033

[22] Filed: Aug. 1, 1978

[30] Foreign Application Priority Data

Aug. 8, 1977 [JP] Japan .................. 52/94795
Aug. 10, 1977 [JP] Japan .................. 52/95802

[51] Int. Cl.³ .................. F02P 5/04; F02M 25/06; G01P 3/48
[52] U.S. Cl. .................. 123/416; 123/568; 73/116; 324/166; 328/5; 328/59
[58] Field of Search .......... 123/117 D, 117 R, 148 E, 123/119 A; 328/1, 5, 59, 65; 324/166; 73/116

[56] References Cited

U.S. PATENT DOCUMENTS

| | | | |
|---|---|---|---|
| 2,701,336 | 2/1955 | Anderson | 328/1 |
| 2,782,304 | 2/1957 | Woods-Hill | 328/59 |
| 3,443,555 | 5/1969 | Gove | 123/148 E |
| 3,809,029 | 5/1974 | Wakamatsu et al. | 123/117 R |
| 4,027,638 | 6/1977 | Moriya et al. | 123/119 A |
| 4,036,190 | 7/1977 | Bigliani et al. | 123/146.5 A |
| 4,071,003 | 1/1978 | Aono | 123/119 A |
| 4,114,573 | 9/1978 | Mori | 123/117 D |
| 4,128,885 | 12/1978 | Valek et al. | 123/119 A |
| 4,164,206 | 8/1979 | Toelle | 123/119 A |

*Primary Examiner*—Charles J. Myhre
*Assistant Examiner*—Andrew M. Dolinar
*Attorney, Agent, or Firm*—Robert E. Burns; Emmanuel J. Lobato; Bruce L. Adams

[57] ABSTRACT

A pulse generator of the corona discharge type for sensing engine crankshaft angle in an engine control system having a rotor with a plurality of pulse generating elements angularly spaced about the rotor axis. In order to generate as many pulses for each revolution of the rotor as desired to permit accurate measurement of the angular displacement of the rotor axis from a reference point, the rotor is constructed of a disc having a plurality of angularly equally spaced apart segmented regions to act as the pulse generating elements, and at least one electrode is stationarily mounted with respect to the disc to form an air gap to generate corona discharges thereacross in succession in cooperation with each one of the segmented regions upon rotation of the disc. An impedence element is provided to develop a voltage signal in response to the generation of the corona discharge.

24 Claims, 15 Drawing Figures

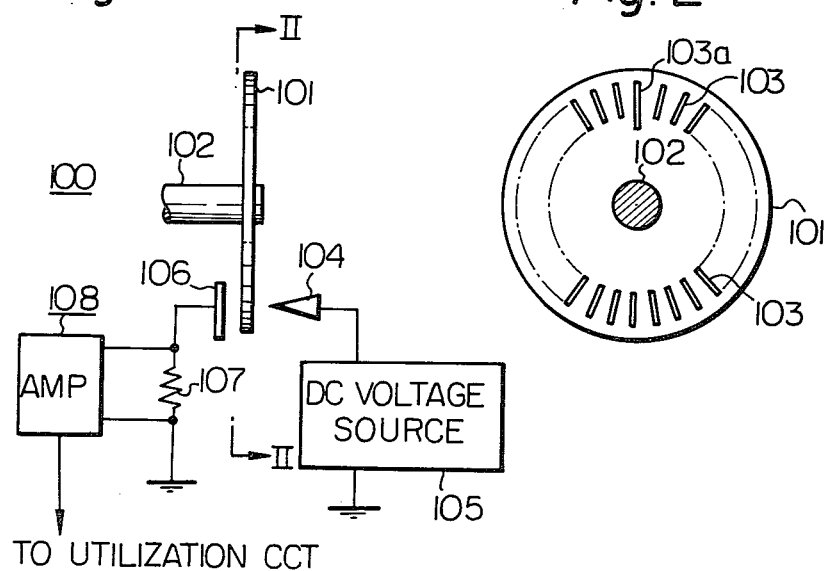
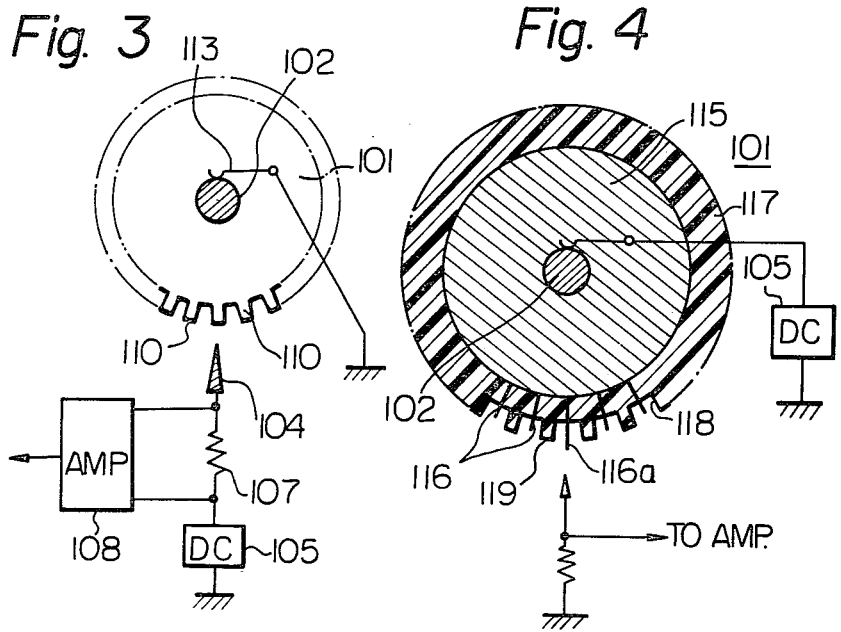

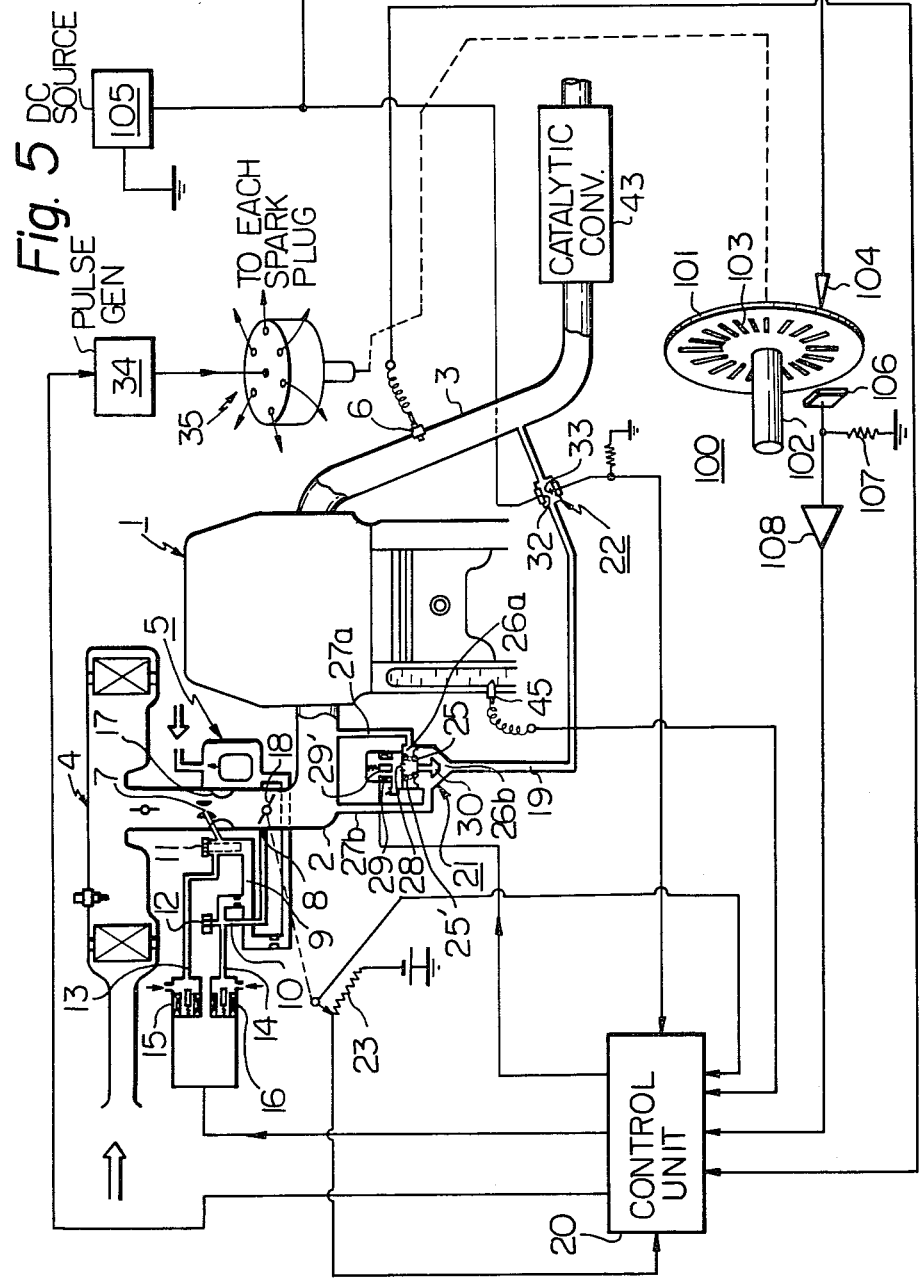

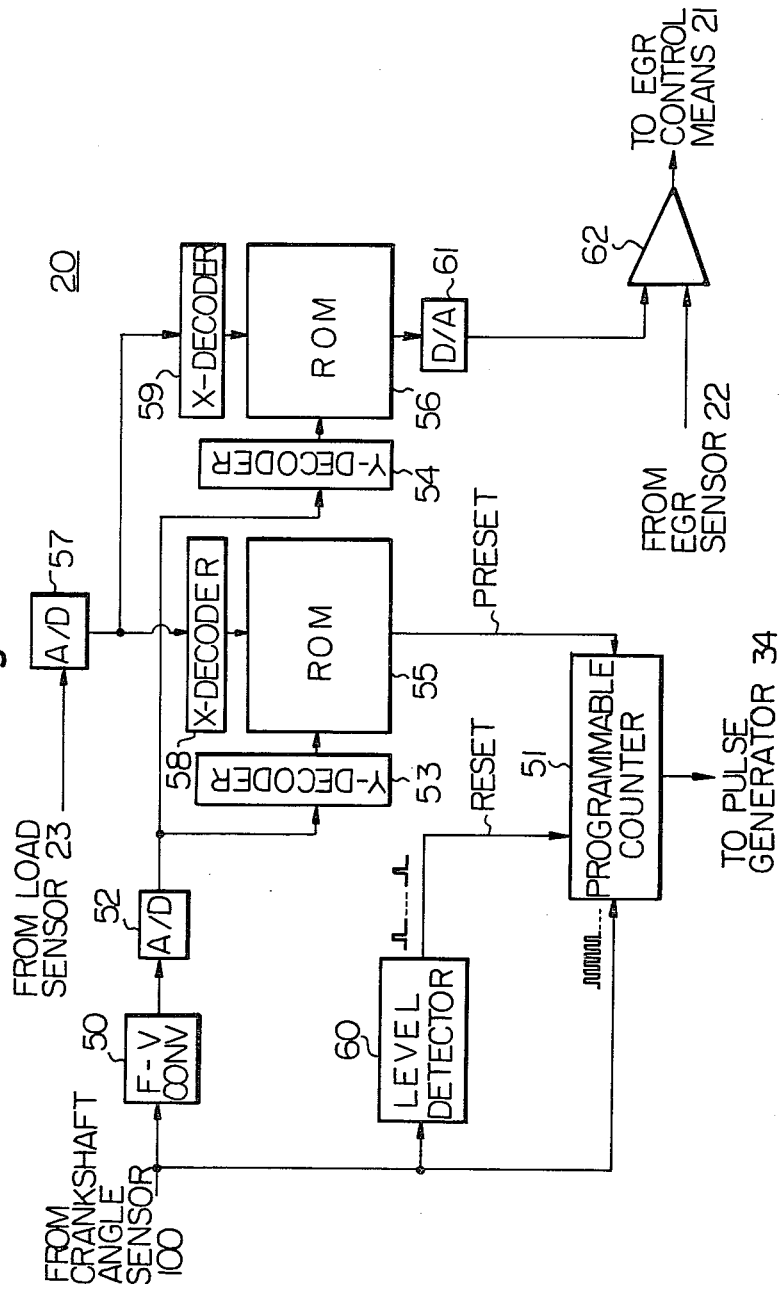

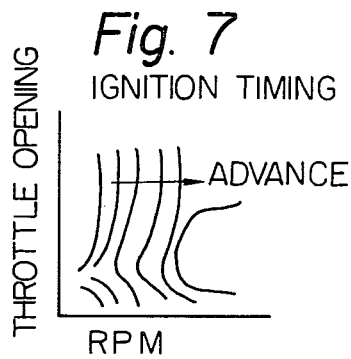
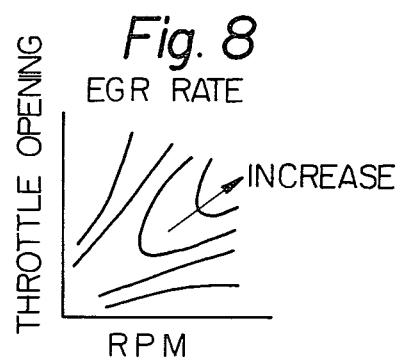
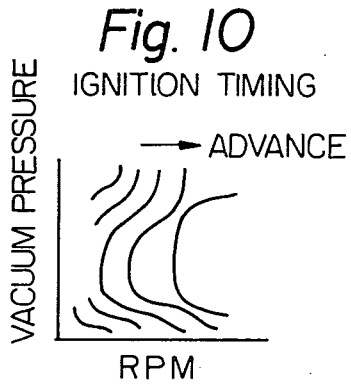
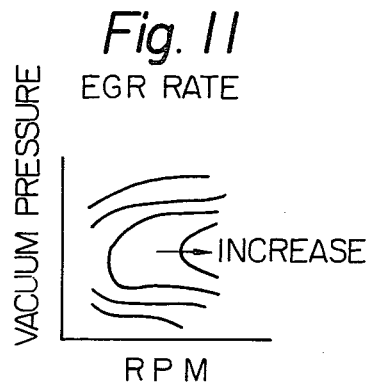
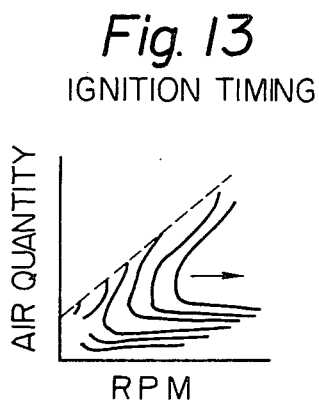
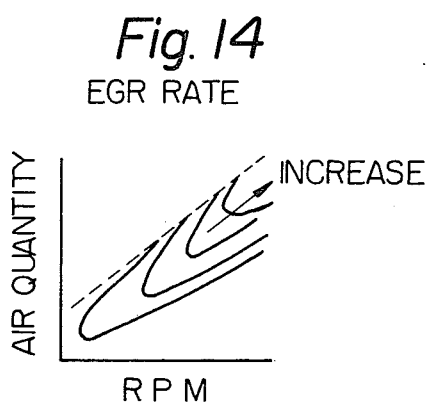

4,231,331

PULSE GENERATOR OF THE CORONA DISCHARGE TYPE FOR SENSING ENGINE CRANKSHAFT ANGLE ON AN ENGINE CONTROL SYSTEM

BACKGROUND OF THE INVENTION

The present invention relates generally to pulse generation, and in particular to a pulse generator of the corona discharge type which is suitable for accurately sensing engine crankshaft angle. The invention is particularly suitable for ignition control systems in which predetermined ignition timing data is stored for use in later retrieval in response to a set of sensed engine speed and power.

Conventional methods of detecting crankshaft angle, or angular displacement of the crankshaft from a reference point, involves the use of electromagnetic or photoelectrical sensing elements mounted on a rotor for rotation with the crankshaft, a stator being provided to detect changes in magnetic flux or optical energy. However, the conventional methods are found to be unsatisfactory because of the difficulty in having as many such sensing elements provided on the restricted space of the rotor surface as desired to generate sufficient number of pulses for each crankshaft revolution to permit accurate measurement of its angular displacement. Accurate measurement of crankshaft angle is essential to the ignition system of internal combustion engines provided with exhaust gas recirculation in which ignition timing is related to the varying rate of recirculated exhaust gases as a function of engine power and speed.

SUMMARY OF THE INVENTION

An object of the invention is to provide a pulse generator using corona discharge as a means of generating electrical pulses each representing the instantaneous value of angular displacement of an engine crankshaft. Since corona discharge can be generated across a pair of oppositely pointed electrodes or elements, it is possible to provide as many such elements on a rotor surface as desired to permit generation of sufficient number of pulses for each crankshaft revolution to provide accurate measurement of crankshaft angle.

The pulse generator of the invention comprises a rotor having a plurality of angularly equally spaced apart segmented regions. Means including at least one electrode, connected to a DC voltage source, is stationarily mounted with respect to the rotor to form a corona discharge generating circuit to generate corona discharges in succession in cooperation with each one of the segmented regions of the rotor. An impedance element is provided in the corona discharge generating circuit to develop a voltage signal in response to each of the generated corona discharges.

Specifically, in a preferred embodiment, the rotor is constructed of an insulative disc having a plurality of angularly equally spaced apart radially extending slits. Two electrodes, one of which is formed with a needle pointed end, and other having an ion collecting surface, are provided in opposite to each other to form a corona discharge path to produce a corona discharge through each one of the rotor slits when each slit comes into alignment with the needle point electrode. Upon rotation of the disc, the corona discharge is interrupted in succession to generate a train of electrical pulses across the impedance element. Because of their configuration, the slits can be closely spaced apart from each other to permit generation of as many pulses as desired.

The pulse generator of the invention can best be utilized in a system which makes use of the interrelationship between ignition timing and EGR (exhaust gas recirculation) rate to achieve best fuel economy and drivability under varying engine operating conditions. Specifically, there is a set of optimum values of ignition and EGR rate for a particular set of engine speed timing and EGR Data concerning optimum ignition timing and EGR rate, which have been determined in advance, are stored in a memory to be retrieved in response to a set of sensed engine speed and power. In order to effect ignition at correct timing, a series of pulses from the pulse generator are counted in a counter in response to the engine cylinder reaching a reference point of its cycle to generate an output when the count reaches a preset number. This preset number is varied in accordance with the data on ignition timing retrieved from the memory.

BRIEF DESCRIPTION OF THE DRAWINGS

The invention will be further described by way of example with reference to the accompanying drawings, in which:

FIG. 1 is a diagrammatic view illustrating the pulse generator of invention;

FIG. 2 is a cross-sectional view taken along the line II—II of FIG. 1;

FIG. 3 is a modification of the embodiment of FIG. 1;

FIG. 4 is a modification of the embodiment of FIG. 3;

FIG. 5 is a diagrammatic view of an engine control system including an ignition control system of an internal combustion engine utilizing the pulse generator of the invention;

FIG. 6 is a schematic diagram of a portion of the control unit of FIG. 5;

FIGS. 7 and 8 are graphic illustrations of ignition timing data and EGR rate data respectively as a function of throttle opening and engine speed;

FIGS. 10 and 11 are graphic illustrations of ignition timing data and EGR rate data respectively as a function of vacuum pressure and engine speed;

FIGS. 13 and 14 are graphic illustrations of ignition timing data and EGR rate data respectively as a function of air quantity and engine speed.

DETAILED DESCRIPTION

Figure 9:
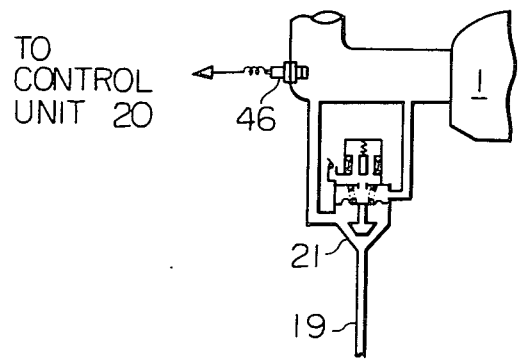
FIG. 9 is a view illustrating the position of a vacuum pressure detector as a load sensor with respect to an EGR control valve.

Referring now to FIG. 1 a corona discharge crankshaft angle detector 100 is illustrated as comprising an insulative disc 101 mounted on a crankshaft 102 for rotation therewith. The disc 101 is formed with a plurality of angularly equally spaced, radially extending identical slits 103 One of the slits, which is identified at 103a, has a longer length in radial direction than the other slits 103 and is so positioned as to correspond to the top dead center (TDC) of the engine cylinder. A needle-point electrode 104 is positioned stationarily with respect to the rotating disc 101 and electrically connected to a terminal of a DC voltage source 105, the other terminal of which is connected to ground. The electrode 104 is pointed toward one side of the perforated rotating disc 101. Adjacent to the other side of the disc 101 is mounted a plate electrode 106 facing the needle electrode 104, the electrode 106 being electrically connected by a resistance element 107 to ground. By application of a high DC potential to the needle electrode 104, there is produced a corona discharge across the two electrodes when a slit 103 is positioned to correspond to the needle electrode 104. Charged particles pass through the corresponding slit to the ion collecting electrode 106 and drained off through the resistor 107 to ground generating a voltage thereacross. This voltage is strengthened by an amplifier 108 and delivered to a utilization circuit which will be described later. The corona discharge is intercepted as the disc 101 rotates terminating the voltage across the resistor 107 so that for each one of the slits 103 an electrical pulse is generated and the frequency of the pulses is thus proportional to the rate of revolution of the crankshaft 102 and hence to the engine speed.

When the cylinder is in the TDC point, the slit 103a is positioned to correspond to the needle electrode 104. Because of its larger aperture, the slit 103a permits generation of a large amplitude pulse which allows the utilization circuit to discirimiate it from the other pulses. A counter may be employed to count each pulse generated in response to each slit 103 from the time of occurrence of the TDC indicating pulse generated in response to the slit 103a to determine the angular displacement or angle of the crankshaft 102 from the TDC point.

The embodiment of FIG. 1 is modified as shown in FIG. 3 in which the disc 101 is formed of a conductive material and provided with a plurality of equally spaced teeth 10 extending radially outwardly from the circumference of the disc. The crankshaft 102 is electrically connected to ground by means of a contactor 111 to bias the conductive disc 101 at the ground potential. The needle electrode 104 is mounted to be pointed toward the center of the disc so as to generate corona discharge across the gap between each tooth and the needle electrode when the former comes to correspond with the latter. Since the magnitude of the corona discharge is inversely proportional to the air gap, the voltage developed across the resistor 107 is a pulsating voltage. One of the teeth 110 is made longer to project from the general periphery of the teeth to generate a large amplitude pulsating voltage to allow discrination from the other pulses to indicate TDC point.

FIG. 4 is a further modification in which the sensor disc 101 comprises metal center disc 115 mounted on the shaft 102, a plurality of needles 116 each connected at one end to the center disc 115 and extending radially outwardly to confront the needle electrode 104, and an insulating disc 117 of a plastic mould in which the center disc 115 and needles 116 are embedded. The insulating body 117 is formed with a plurality of cutout portions 118 on its circumference and each needle 116 is arranged to partly extend into the cutout portion 118, with the radial extension being smaller than the radial extent of the cutout portion 118 except for a needle 116a which serves as a detector for TDC point. The cutout portion 118 provides an air space around the outer end of needle 116 to permit it to readily produce sparks, while the toothed portion 119 serves to break up the corona discharge previously generated and permit isolation of adjacent needles to thereby prevent simultaneous occurrences of more than one corona discharge.

The crankshaft angle detector of the present invention is best suited for applications where the ignition timing is accurately controlled. An exemplary of such applications is illustrated in FIG. 5. In FIG. 5, intake air is inducted through an air cleaner 4 and a main air intake passageway 2 where it is mixed with fuel to the internal combustion engine 1 for combustion therein and the spent gases are exhausted through pipe 3 in which a three-way catalytic converter 43 is provided for the purposes of converting noxious components into harmless waste products. Upstream from the catalytic converter 43 is provided an exhaust gas sensor 6 such as an oxygen sensor to provide a signal representative of the oxygen content of the spent gases as an indication of the air-fuel ratio of the mixture, this signal being supplied to a control unit 20 such as a microcomputer where the signal is compared with a reference level representing a near stoichiometric air-fuel ratio to actuate a pair of on-off type valves 15 and 16 with a signal representing the deviation of the sensed air-fuel ratio from the desired value. The valve 15 is shown connected through passage 13 to an air bleed or emulsion chamber 11, connected to a fuel source 5 through passage 9, to supply main air-fuel mixture to the intake passage 2 through a main nozzle 7 positioned near the venturi 17. The valve 16, on the other hand, is connected through passage 14 to another air bleed 12 to deliver auxiliary mixture through an idling port or slow nozzle 8, located adjacent the throttle control valve 18, into the intake passage 2.

In order to control the on-off valves 15 and 16, the control unit 20 delivers a train of electrical pulses of the duration proportional to the air-fuel deviation so that the open time of each valve and hence the amount of air inducted through main and idling ports is made proportional to the amount of deviation of air-fuel ratio from the desired control point.

An exhaust gas recirculation passageway 19 is provided between the exhaust pipe 3 downstream from the exhaust gas sensor 6 and the intake air passageway 2. In the EGR passageway 19 is located a sensor 24 which detects the amount of recirculated exhaust gases and delivers a control signal to the control unit 20 to permit it to operate an exhaust gas recirculation control valve 21. The EGR sensor 22 is comprised by an electrode 32 connected to a source of high DC voltage 31 and an ion collecting electrode 33 which is connected to ground. Both electrodes are mounted in opposite relation to permit the exhaust gases to pass therebetween to produce a corona discharge to ionize the passing fluid. Since the electrodes 32 and 33 are mounted transverse to the direction of exhaust gas fluid, the amount of collected ions is inversely proportional to the speed and hence the amount of recirculated gases. It is also possible to measure the recirculated fluid by mounting the collecting electrode 33 at a position downstream from the high voltage electrode 32.

The EGR control valve 21 comprises a chamber in which is mounted a diaphragm 25 which divides the chamber into a vacuum pressure chamber portion 26a, communicated through passageway 27a to the intake air passageway 2 and to the atmosphere through an opening 28, and an exhaust gas chamber portion 26b, communicated through passageway 27b to the intake passageway 2 and in which is disposed a valve member 26 secured at one end to the diaphragm 25 and having a reduced diameter portion at the other end which confronts the outlet end of the EGR passageway 19. The diaphragm 25 is secured in position by means of a coiled spring 25' to move the valve member 30 in response to vacuum pressure variations. The opening 28 is closed by means of a plunger 29' slidably disposed in a solenoid 29 in response to an electrical drive pulse supplied from the control unit 20 so as to vary the relative pressure within the vacuum pressure chamber 26a to the pressure within the EGR chamber portion 26b thereby allowing the valve member 30 to vary the amount of gases to be recirculated through passageway 27b to the intake passageway 2.

A crankshaft angle detector 100 is provided for detecting the angular displacement of the engine crankshaft from the top dead center of the engine cylinder head and supplies a signal to the control unit 20 to permit it to determine the appropriate ignition timing in relation to the signal received from the EGR sensor as described later to operate the ignition pulse generator 34 connected to the ignition distributer 35. The angle detector 100 is shown as comprising insulator disc 101 mounted for rotation with the engine crankshaft and formed with a plurality of angularly spaced identical slits 103 and a needle-pointed corona discharge electrode 104 connected electrically to the high voltage DC source 105 and an ion collecting plate electrode 106 connected to ground through a resistor 107. Both electrodes are disposed in proximity to each other and the rotating disc 101 lies on a plane between them to periodically intercept the passage of the arc produced as a result of the corona discharge as it revolves with the crankshaft. The voltage developed across the resistor 107 represents the collected ions which passed through the slit 103 and varies sharply as the passage of the ions is intercepted to generate a train of pulses at a frequency proportional to the engine speed. To permit the system to identify the top dead center, one of the slits 103 has a larger area than the others to allow a greater amount of ions to pass therethrough to generate a large amplitude pulse to be discriminated from the other pulses. Through an amplifier 41 the pulses are supplied to the control unit 20. Since the slits 103 can be spaced close to each other, high resolution angular displacement can be measured. The control unit 20 includes means for discriminating the larger and smaller amplitude pulses from amplifier 41 and means for counting the smaller amplitude pulses in response to receipt of a larger amplitude pulse to determine the angular displacement or crankshaft angle from the top dead center. Also included in the control unit is means for converting the number of pulses generated per unit time into a voltage signal to represent the engine speed.

The throttle control valve 18 is connected by means of a suitable linkage to operate a variable resistor 23 to develop a voltage signal representing the throttle opening for delivery to the control unit 20.

The details of the control unit 20 are illustrated in FIG. 6. The pulses supplied from the pulse generator 100 are fed into a frequency-to-voltage converter 50 on the one hand wherein the input signal is converted into a voltage signal representative of the engine speed, and on the other hand to a programmable counter 51. The voltage signal from the frequency-to-voltage converter 50 is applied to an analog-to-digital converter 52 for driving Y-decoders 53 and 54 of read only memories 55 and 56, respectively. The output from the load sensor 23 is also digitalized by an analog-to-digital converter 57 and applied to X-decoders 58 and 59 of the memories 55 and 56, respectively. In ROM 55 there is stored ignition timing information in an X-Y array. Experiments have been conducted to investigate the optimum values of ignition timing and EGR rates which give the best engine performance and fuel economy for particular engine conditions. The engine was operated under different load conditions at different speeds and the best ignition timing and EGR rate for a particular set of conditions are plotted. FIG. 7 is a graphic illustration of ignition timing determined by combinations of throttle opening and engine speed wherein each curve represents iso-ignition line. FIG. 8 is a graphic illustration of EGR rates represented by a plurality of iso-EGR lines as a function of throttle opening and engine speed.

The read only memory 55 is energized to store a digital representation of ignition timing at each intersection of X-Y array in accordance with the data of FIG. 7. Likewise, the read only memory 56 stores the digital representation of the data of FIG. 8 in its X-Y array. In response to each set of input signals from load sensors 23 and crankshaft angle sensor 100, the X- and Y-decoders identify an address in each memory in which desired information is stored. Output data from the ROM 55 is thus representative of the best spark timing for the input variable which is used to preset the number of counts to be counted in the programmable counter 51. A level detector 60 is provided to discriminate the TDC pulse from the train of other pulses and supplies it to the counter 51 as a rest pulse. Therefore, the counter 51 starts counting the input pulses in response to the reset pulse until the present number is reached, whereupon an output pulse is generated which is applied to ignition pulse generator 34. On the other hand, the output data from ROM 56 is converted into analog form by a digital-analog converter 61 and applied to a comparator 62 for comparison with an output signal from the EGR sensor 22 to deliver a signal representing the deviation of the sensed EGR rate from the desired EGR rate retrieved from the ROM 56, the deviation signal being applied to the EGR control means 21. Therefore, exhaust recirculation is controlled on a feedback loop principle to reduce the amount of deviation from the desired EGR rate so that actual EGR rate is always controlled at the optimum value.

Figure 12:
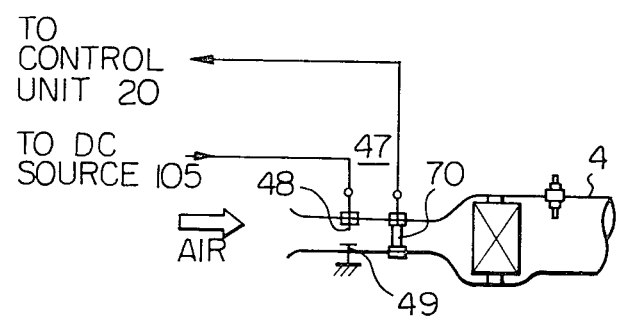
FIG. 12 is a view illustrating an air quantity sensor to be used as a load sensor.
Figure 15:
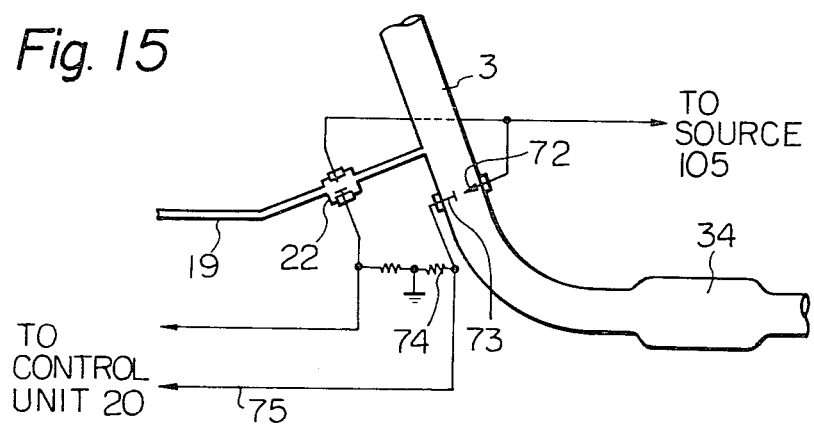
FIG. 15 is an alternative arrangement of the load sensor of FIG. 12.

The load sensor may also be represented by intake vacuum pressure. In this case a vacuum pressure detector 46 is mounted on the wall of the intake passageway 2 upstream of the EGR control valve 21 as shown in FIG. 9. FIGS. 10 and 11 are graphic illustrations of ignition timing and EGR rate, respectively, derived from experiments using vacuum pressure as a load representative factor. Therefore, if the vacuum pressure sensor 46 is employed instead of the throttle opening sensor 23, data on the curves of FIGS. 10 and 11 are stored on ROMs 55 and 56, respectively, in digital form. It is also possible to utilize air quantity inducted as a load sensor. In this instance an air quantity sensor 47 is provided in a manner as shown in FIG. 12. The air quantity sensor 47 comprises a pair of corona discharge electrodes 48 and 49 mounted on the inlet port of the air intake passage 4, the electrode 48 being connected to the DC voltage source 105 and the electrode 49 being connected to ground. An ion collecting electrode 70 is provided downstream from the ion producing electrode pair 48, 49. The amount of ions, which drift along with the air stream, are proportional to the speed of the air stream so that the amount of collected ions represents the air quantity inducted per unit time. The electrode 70 is connected to the control unit 20 as a load representing signal. FIGS. 13 and 14 illustrate the data to be stored in ROMs 55 and 56, respectively, as a function of air quantity and engine speed. Since the inducted air quantity is proportional to the amount of exhaust gases, the latter can also be used as a factor to represent the engine load. An arrangement shown in FIG. 15 is an alternative embodiment of the load sensor of FIG. 12, wherein a pair of electrodes 72 and 73 is provided in the exhaust pipe 3 downstream from the EGR control duct 19 with the electrode 72 being connected to the DC voltage source 105 and the other electrode 73 being connected to ground by a resistor 74 to develop a voltage signal representing the quantity of exhaust gases for application to the control unit 20 through lead 75.

The embodiments shown and described above are only illustrative of the present invention. Various modifications are apparent to those skilled in the art. For example, the reference timing signal generated in response to the TDC point may also be provided by the provision of a separate disc coaxially mounted on the same rotor shaft with the disc previously described, the separate disc having a segmented region corresponding to the TDC point to cooperate with a separate corona discharge means. Alternatively, an additional segmented region or slit may be provided adjacent to one of the slits 103 so that the spacing therebetween is smaller than the spacing between any other adjacent ones to permit the closely spaced slits to be recognized as the TDC timing reference point.

What is claimed is:

1. A pulse generator comprising:
    a rotor having a plurality of angularly equally spaced apart segmented regions;
    electrode means stationarily mounted with respect to said rotor to define an air gap with each one of said segmented regions upon rotation of said rotor and connected to a source of DC potential to form a corona discharge generating electrical circuit through said air gap to successively generate corona discharges across said air gap upon rotation of said rotor; and
    an impedance element provided in said corona discharge generating electrical circuit to develop voltage pulses in response to said corona discharges.

2. A pulse generator as claimed in claim 1, wherein said rotor comprises an electrically nonconductive disc provided with a plurality of angularly equally spaced apart radially extending slits, and said electrode means comprises a first electrode connected to a first terminal of said DC potential source and a second electrode connected to a second terminal of said potential source, said first and second electrodes being spaced apart to define said air gap with said disc being disposed therebetween to generate corona discharges in a path formed through said slits upon rotation of said disc, said impedance element being connected in series with said first and second electrodes through said air gap.

3. A pulse generator as claimed in claim 2, wherein said first electrode is shaped into a needle point and said second electrode comprises a conductive plate.

4. A pulse generator as claimed in claim 3, wherein said impedance element is connected to said plate electrode.

5. A pulse generator, for use as a crankshaft angle sensor, as claimed in claim 2, 3 or 4 wherein one of said slits has a different dimension from the dimension of the other slits, and wherein said disc is mounted on a crankshaft of an internal combustion engine and said slit of different dimension is so arranged in said disc as to coincide with the path of said corona discharges when said crankshaft corresponds to a reference point of its revolution.

6. A pulse generator as claimed in claim 1, wherein said rotor is formed of an electrically conductive disc and connected to a first terminal of said potential source and is provided with a plurality of angularly equally spaced apart toothed portions around the circumference thereof, and wherein said electrode means comprises a needle point electrode connected to a second terminal of said potential source, the needle point of said electrode being adjacent to the circumference of said disc.

7. A pulse generator as claimed in claim 6, wherein said needle point electrode is disposed such that its axis is successively aligned with each of said toothed portions upon rotation of said disc.

8. A pulse generator, for use as a crankshaft angle sensor, as claimed in claim 6 or 7, wherein one of said toothed portions has a longer radial dimension than the dimension of the other toothed portions, and wherein said disc is mounted on a crankshaft of an internal combustion engine and said toothed portion of longer radial dimension is so arranged in said disc as to be aligned with said needle point electrode when said crankshaft corresponds to a reference point of its revolution.

9. A pulse generator as claimed in claim 1, wherein said rotor comprises a plurality of angularly equally spaced apart radially extending conductive needles electrically connected together to a first terminal of said potential source, an electrically nonconductive disc having a plurality of cutout portions around the circumference thereof, said conductive needles being integrally embedded in said nonconductive disc such that each of said conductive needles partly extends into each of said cutout portions and said partly extending portions of the needles being separated from each other by a noncutout portion of said nonconductive disc, and wherein said electrode means comprises a needle point electrode connected to a second terminal of said potential source and aligned with each of said conductive needles upon rotation of said disc.

10. A pulse generator, for use as crankshaft angle sensor, as claimed in claim 9, wherein one of said conductive needles has a longer radial extension than the dimension of the other needles, and wherein said rotor is mounted on a crankshaft of an internal combustion engine and said conductive needle of longer radial extension is so arranged in said disc as to be aligned with said needle point electrode when said crankshaft corresponds to a reference point of its revolution.

11. A pulse generator, for use as a crankshaft angle sensor, as claimed in claim 1, wherein one of said segmented regions has a different dimension from the dimension of the other segmented regions, and wherein said rotor is mounted on a crankshaft of an internal combustion engine and said segmented region of different dimension is so arranged in said rotor as to generate a corona discharge when said crankshaft corresponds to a reference point of its revolution.

12. A spark timing and exhaust gas recirculation control system for an internal combustion engine, comprising:
    means for producing a signal representative of the amount of exhaust gases recirculated through said engine;

means for producing a signal representative of the speed of said engine;

means for generating a first pulse in response to an engine cylinder reaching a reference point of its combustion cycle and second pulses the frequency of which is proportional to the speed of said engine;

means for producing a signal representative of power which said engine delivers;

first storage means in which is stored a set of data each representative of the spark timing of said engine cylinder as a function of a set of engine speed and engine power values for generating a corresponding output in response to said signals representative of said engine speed and engine power;

second storage means in which is stored a set of data each representative of the rate of exhaust gas recirculation as a function of a set of engine speed and engine power values for generating a corresponding output in response to said signals representative of said engine speed and engine power;

counter means arranged to be preset in accordance with the output from said first storage means for counting said second pulses in response to each said first pulse and generating a spark timing pulse in response to the counted second pulses reaching said preset count value; and means for comparing said signal representative of the amount of recirculated gases with the output from said second storage means to detect the difference therebetween for regulating said recirculated gases;

wherein said means for generating first and second pulses comprises a rotor mounted for revolution with said engine and having a plurality of angularly equally spaced apart segmented regions, electrode means stationarily mounted with respect to said rotor to define an air gap with each one of said segmented regions upon rotation of said rotor and connected to a source of DC potential to form a corona discharge through said air gap to successively generate corona discharges across said air gap upon rotation of said rotor, and an impedance element responsive to each of said corona discharges to develop a signal corresponding to said first and second pulses, one of said segmented regions having a different dimension from the dimension of the other segmented regions and being arranged in said rotor to coincide with the path of said corona discharge in response to said engine cylinder reaching said reference point.

13. A spark timing and exhaust gas recirculation control system as claimed in claim 12, wherein said means for generating an engine speed representative signal comprises means for converting said second pulses into a voltage signal.

14. A spark timing and exhaust gas recirculation control system as claimed in claim 12 or 13, wherein said data is stored in an array of coordinate axes in each of said first and second storage means.

15. A spark timing and exhaust gas recirculation control system as claimed in claim 14, wherein each of said first and second storage means comprises a read only memory.

16. A spark timing and exhaust gas recirculation control system as claimed in claim 12, wherein said rotor comprises an electrically nonconductive disc provided with a plurality of angularly equally spaced apart radially extending slits, and said electrode means comprises a first electrode connected to a first terminal of said DC potential source and a second electrode connected to a second terminal of said potential source, said first and second electrodes being spaced apart to define said air gap with said disc being disposed therebetween to generate corona discharges in a path formed through said slits upon rotation of said disc, said impedance element being connected in series with said first and second electrodes through said air gap.

17. A spark timing and exhaust gas recirculation control system as claimed in claim 16, wherein said first electrode is provided with a needle point and said second electrode comprises a conductive plate in opposed relation to said needle point of said first electrode.

18. A spark timing and exhaust gas recirculation control system as claimed in claim 17, wherein said impedance element is connected to said plate electrode.

19. A spark timing and exhaust gas recirculation control system as claimed in claim 16 or 17 or 18, wherein one of said slits has a different dimension from the dimension of the other slits and arranged to coincide with the path of said corona discharge in response to said engine cylinder reaching said reference point.

20. A spark timing and exhaust gas recirculation control system as claimed in claim 12, wherein said rotor is an electrically conductive disc connected to a first terminal of said potential source has a plurality of angularly equally spaced apart toothed portions around the circumference thereof, and wherein said electrode means comprises a needle point electrode connected to a second terminal of said potential source, the needle point of said electrode being adjacent to the circumference of said disc.

21. A spark timing and exhaust gas recirculation control system as claimed in claim 20, wherein said needle point electrode is disposed such that its axis is successively aligned with each of said toothed portions of said rotor upon rotation of said rotor.

22. A spark timing and exhaust gas recirculation control system as claimed in claims 20 or 21, wherein one of said toothed portions has a longer radial dimension than the dimension of the other toothed portions, and wherein said toothed portion of longer radial dimension is arranged to coincide with the path of corona discharge when said engine cylinder reaches said reference point.

23. A spark timing and exhaust gas recirculation control system as claimed in claim 12, wherein said rotor comprises a plurality of angularly equally spaced apart radially extending conductive needles electrically connected together to a first terminal of said potential source, an electrically nonconductive disc having a plurality of cutout portions around the circumference thereof, said conductive needles being integrally embedded in said nonconductive disc such that each of said conductive needles partly extends into each of said cutout portions and said partly extending portions of the needles being separated from each other by a noncutout portion of said nonconductive disc, and wherein said electrode means comprises a needle point electrode connected to a second terminal of said potential source and aligned with each of said conductive needles upon rotation of said disc.

24. A spark timing and exhaust gas recirculation control system as claimed in claim 23, wherein one of said conductive needles has a longer radial extension than the dimension of the other needles and arranged to be aligned with said needle point electrode when said engine cylinder reaches said reference point.

* * * * *